(12) United States Patent
Shen et al.

(10) Patent No.: US 11,368,132 B2
(45) Date of Patent: Jun. 21, 2022

(54) LOW DELAY, LOW POWER AND HIGH LINEARITY CLASS-D MODULATION LOOP

(71) Applicant: SYNAPTICS INCORPORATED, San Jose, CA (US)

(72) Inventors: Dan Shen, Irvine, CA (US); Yunfu Zhang, Sichuan Sheng (CN); Lorenzo Crespi, Irvine, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 17/119,978

(22) Filed: Dec. 11, 2020

(65) Prior Publication Data

US 2021/0203286 A1    Jul. 1, 2021

Related U.S. Application Data (60) Provisional application No. 62/953,823, filed on Dec. 26, 2019.

(51) Int. Cl.
| | | |
|---|---|---|
| *H03F 3/217* | (2006.01) | |
| *H03F 3/185* | (2006.01) | |
| *H03M 3/00* | (2006.01) | |

(52) U.S. Cl.
CPC ........... *H03F 3/2171* (2013.01); *H03F 3/185* (2013.01); *H03M 3/39* (2013.01); *H03M 3/482* (2013.01)

(58) Field of Classification Search
CPC .......... H03F 3/2171; H03F 3/185; H03F 1/26; H03F 1/32; H03F 3/2175; H03F 2200/03; H03F 3/68; H03F 3/187; H03F 3/217; H03F 1/02; H03F 3/183; H03F 2200/331; H03M 3/39; H03M 3/482; H03M 3/43; H03M 3/454; H03M 3/358

USPC ........................................ 330/10, 207 A, 251
See application file for complete search history.

(56) References Cited

U.S. PATENT DOCUMENTS

| | | | |
|---|---|---|---|
| 5,974,089 A | * | 10/1999 | Tripathi ................ H03M 3/376 375/247 |
| 6,055,168 A | | 4/2000 | Kotowski et al. |
| 6,169,673 B1 | | 1/2001 | McIntyre et al. |
| 6,693,808 B2 | | 2/2004 | Myono |
| 6,753,623 B2 | | 6/2004 | McIntyre et al. |

(Continued)

OTHER PUBLICATIONS

Bayer, Erich et al., "Change Pump With Active Cycle Regulation—Closing the Gap Between Linear—and Skip Modes", dated 2000 IEEE, pp. 1497-1502.

(Continued)

*Primary Examiner* — Hieu P Nguyen
(74) *Attorney, Agent, or Firm* — Paradice & Li LLP (57) ABSTRACT

Systems and methods include a circuit having a plurality of integrator circuits arranged in series and configured to receive an input signal at a first of the plurality of integrators and generate an output signal at a last of the plurality of integrators, a filter arranged to receive a feedback signal comprising the output signal and generate a filtered feedback signal, which is applied to the input signal before input to the first of the plurality of integrators, and a feedback signal path configured to receive the feedback signal and apply the feedback signal to an input of a second of the plurality of integrators. The circuit may include a class-D amplifier and/or a delta-sigma modulator. The input signal may include an analog audio signal that is amplifier to drive an audio speaker.

20 Claims, 5 Drawing Sheets

(56) References Cited

U.S. PATENT DOCUMENTS

| | | |
|---|---|---|
| 7,342,389 B1 | 3/2008 | Wu et al. |
| 8,553,909 B2 * | 10/2013 | Fortier .................... H03F 3/217 |
| | | 381/120 |
| 8,797,770 B2 | 8/2014 | Conta et al. |
| 9,906,122 B2 | 2/2018 | Crespi et al. |
| 10,084,369 B2 | 9/2018 | Shen et al. |
| 2011/0133963 A1 | 6/2011 | Kawai |
| 2012/0250381 A1 | 10/2012 | Takahashi |
| 2012/0268086 A1 | 10/2012 | Chou et al. |
| 2013/0141071 A1 | 6/2013 | Conta et al. |
| 2013/0294125 A1 | 11/2013 | Chen |
| 2014/0002043 A1 | 1/2014 | Li et al. |
| 2014/0117955 A1 | 5/2014 | Zoso |
| 2014/0225583 A1 | 8/2014 | Huang |
| 2015/0280590 A1 | 10/2015 | Maede |
| 2016/0301303 A1 | 10/2016 | Bari |
| 2017/0168515 A1 | 6/2017 | Beck |
| 2018/0032096 A1 | 2/2018 | Beck |

OTHER PUBLICATIONS

Ma Mengzhe, "Design of High Efficiency Step-Down Switched Capacitor DC/DC Converter", A Thesis Submitted to Oregon State University, dated May 21, 2003, 6 pages.

\* cited by examiner

LOW DELAY, LOW POWER AND HIGH LINEARITY CLASS-D MODULATION LOOP

CROSS-REFERENCE TO RELATED APPLICATIONS

This application claims priority to and the benefit of U.S. Provisional Patent Application No. 62/953,823 filed Dec. 26, 2019, entitled "LOW DELAY, LOW POWER AND HIGH LINEARITY CLASS-D MODULATION LOOP", which is hereby incorporated by reference in its entirety.

TECHNICAL FIELD

The present disclosure, in accordance with one or more embodiments, relates generally to amplifiers and, more particularly for example, to a class-D audio amplifier with improved loop response.

BACKGROUND

Many modern devices such as laptop computers, computer tablets, MP3 players, and smart phones provide for speaker and headphone connectivity utilizing internal audio amplifiers. Class-D amplifiers are commonly used to drive these speakers and headsets. A class-D amplifier has higher efficiency than a class-AB amplifier and can meet performance criteria for mobile devices including low power consumption, linearity and latency requirements. Due to miniaturization of modern devices and increased performance requirements, there is a continued need to reduce power consumption, reduce latency, and improve linearity of audio amplifiers.

SUMMARY

The present disclosure provides systems and methods that address a need in the art for improved performance of audio amplifiers used in modern devices. In class D amplifiers having a plurality of integrators in series, it is observed that a first stage integrator may control noise and distortion in the output signal because the first integrator has the highest overall gain among all integrators. Therefore, the first integrator is selected for good linearity and low noise, and usually determines the overall quiescent current of the amplifier. The present disclosure, through selectively prefiltering feedback signal at first integrator (e.g., only the first integrator), helps to greatly reduce the loop response of a class D amplifier. The resulting amplifier is characterized with low delay and high linearity without needing high power analog operational amplifiers.

In various embodiments, a method for operating an audio amplifier comprises receiving an audio input signal at an input of an audio amplifier circuit comprising a plurality of integrators arranged in series, processing the audio input signal through the plurality of integrators arranged in series, generating an audio output signal using a quantizer arranged to receive an output from a last of the plurality of integrators, feeding back the audio output signal as a feedback signal which is applied to an input of each of the plurality of integrators, and filtering the feedback signal applied to an input of a first of the plurality of integrators arranged in series. The method may further comprise feeding an output of the last integrator in series to a comparator which generates the audio output signal. A first of the plurality of integrators in series may receive the audio input signal and generate a first output which is provided as an input to a second of the plurality of integrators in series.

In some embodiments, the method further comprises filtering the feedback signal applied to the input of the first of the plurality of integrators arranged in series comprises applying the feedback signal to a digital to analog converter. An output of the digital to analog converter (e.g., a 1-bit DAC) is subtracted from respective inputs to a second of the plurality of integrators in series and a comparator which generates the audio output signal, in various embodiments.

In various embodiments, a circuit comprises a plurality of integrator circuits arranged in series and configured to receive an input signal at a first of the plurality of integrators and generate an integrated signal from a last of the plurality of integrators, a quantizer arranged to receive the integrated signal and generate an output signal, a filter arranged to receive a feedback signal comprising the output signal and generate a filtered feedback signal, which is applied to an input of the first of the plurality of integrators, and a feedback signal path configured to receive the feedback signal and apply the feedback signal to an input of a second of the plurality of integrators. The circuit may include a class-D amplifier, a delta-sigma modulator, or similar arrangement.

In some embodiments, the quantizer is configured to receive an output generated from a last of the plurality of integrators and generate an amplified audio output signal. A first of the plurality of integrators arranged in series may be configured for higher linearity and/or lower noise than other of the plurality of integrators.

In various embodiments, a system comprises an audio amplifier configured to receive an audio input signal and output an amplified audio signal to a loudspeaker. The audio amplifier comprises a plurality of integrators arranged in series to receive the audio input signal and generate the amplified audio signal, and a feedback signal path configured to filter the amplified output signal and generate a filtered feedback signal which is applied to the audio input signal before input to a first of the plurality of integrators.

In some embodiments, the audio amplifier further comprises a quantizer configured to receive an output generated from a last of the plurality of integrators and generate the amplified audio signal. A first of the plurality of integrators arranged in series is configured for higher linearity and/or lower noise than other of the plurality of integrators. The feedback path is further configured to apply an unfiltered feedback signal to an input to a second of the plurality of integrators in series and/or one or more subsequent integrators. In one embodiment, the audio amplifier is configured to apply an unfiltered feedback signal to the input of the second of the plurality of integrators in series and/or one or more subsequent integrators comprises subtracting the unfiltered feedback signal from the output of an immediately preceding integrator in series. The system may further comprise a plurality of subtractor components, each of the subtractor components arranged to receive the output from one of the integrators and the unfiltered feedback signal. In some embodiments, the system further comprises a digital signal processor configured to generate the audio input signal.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

The present disclosure provides systems and methods that address a need in the art for improved performance of audio amplifiers used in modern devices. In class D amplifiers, it is observed that the selection of a first stage integrator effectively controls the noise and distortion of the amplifier, because the first integrator has the highest overall gain among the integrators and usually determines the overall quiescent current of the amplifier. Therefore, the selection of a first integrator with good linearity and low noise will improve amplifier performance. Some embodiments of the present disclosure, through selectively prefiltering a feedback signal at the first integrator only, help to greatly reduce the requirement to achieve a class-D amplifier with fast loop response. The low delay and high linearity is achieved in the present disclosure without needing high power analog operational amplifiers.

In one embodiment, an audio amplifier circuit includes two or more stages configured to receive an audio input signal and provide an amplified audio signal to a speaker. The audio amplifier circuit reduces power consumption of a class-D amplifier and reduces delay and distortion of the class-D output. The speaker may be implemented within a headphone or other type of portable audio device. It will be appreciated that the circuitry and techniques described herein may be applicable to a variety of amplifier implementations where improved performance is desired.

Figure 1:
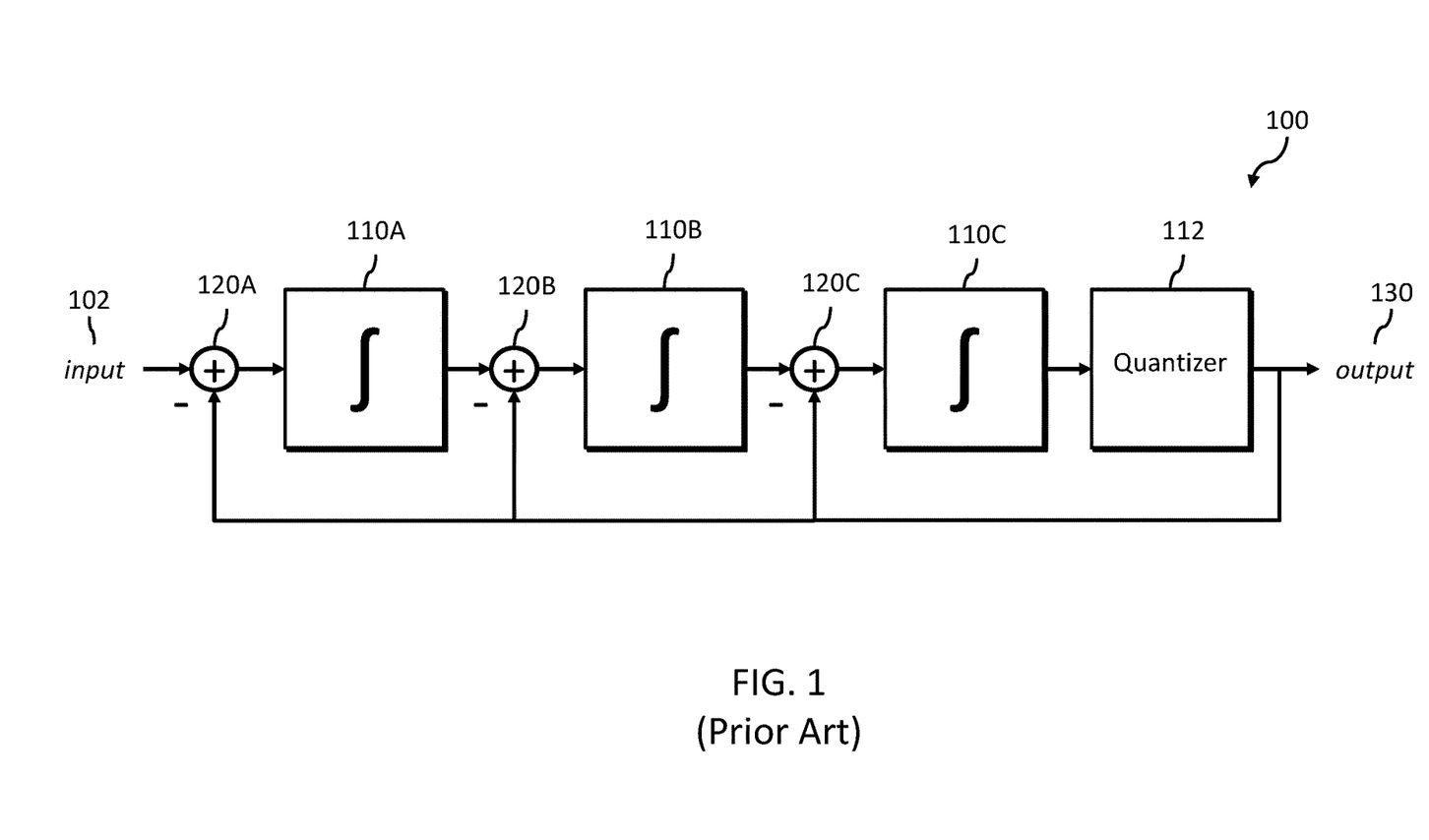
FIG. 1 illustrates a conventional class-D architecture.

A conventional class-D amplifier architecture is illustrated in FIG. 1. The class-D amplifier circuit 100 receives an input audio signal 102, such as an audio signal for output to a speaker. The input audio signal 102 is fed through a plurality of integrators 110A, 110B and 110C followed by a quantizer 112 to produce an amplified audio output signal 130. The audio output signal is fed back and subtracted from the input to each of the plurality of integrators 110A, 110B and 110C by component 120A, 120B and 120C, respectively. To be able to handle a fast class-D signal as input, the integrators 110A-C of the class-D amplifier circuit 100 are designed with a high bandwidth, which produces a circuit with relatively high-power consumption.

By adding filtering to the feedback path, the class-D amplifier bandwidth can be relaxed, reducing overall power consumption. However, adding the filter changes the transfer function of the amplifier. To make the regulated loop function in a stable manner with good loop gain as before adding the filter, the overall loop response is slowed such that the added filter does not negatively impact the loop filter response. Therefore, in conventional designs there are limitations on the amount of filtering that can be added. Further, the overall loop filter response needs to be significantly slower to accommodate the added filter.

It is observed that the first stage integrator (e.g., integrator 110A) of a class-D amplifier circuit has the largest impact on noise and distortion, because first integrator has the highest overall gain among all the integrators 110A-C. In accordance with one or more embodiments of the present disclosure, a class-D amplifier circuit is implemented in which the first integrator is configured for high linearity and low noise. After the first integrator is configured for acceptable performance, it can correct problems from the second integrator (e.g., integrator 110B) and the third integrator (e.g., integrator 110C). In many implementations, the selection of the first integrator determines the overall quiescent current.

Figure 2:
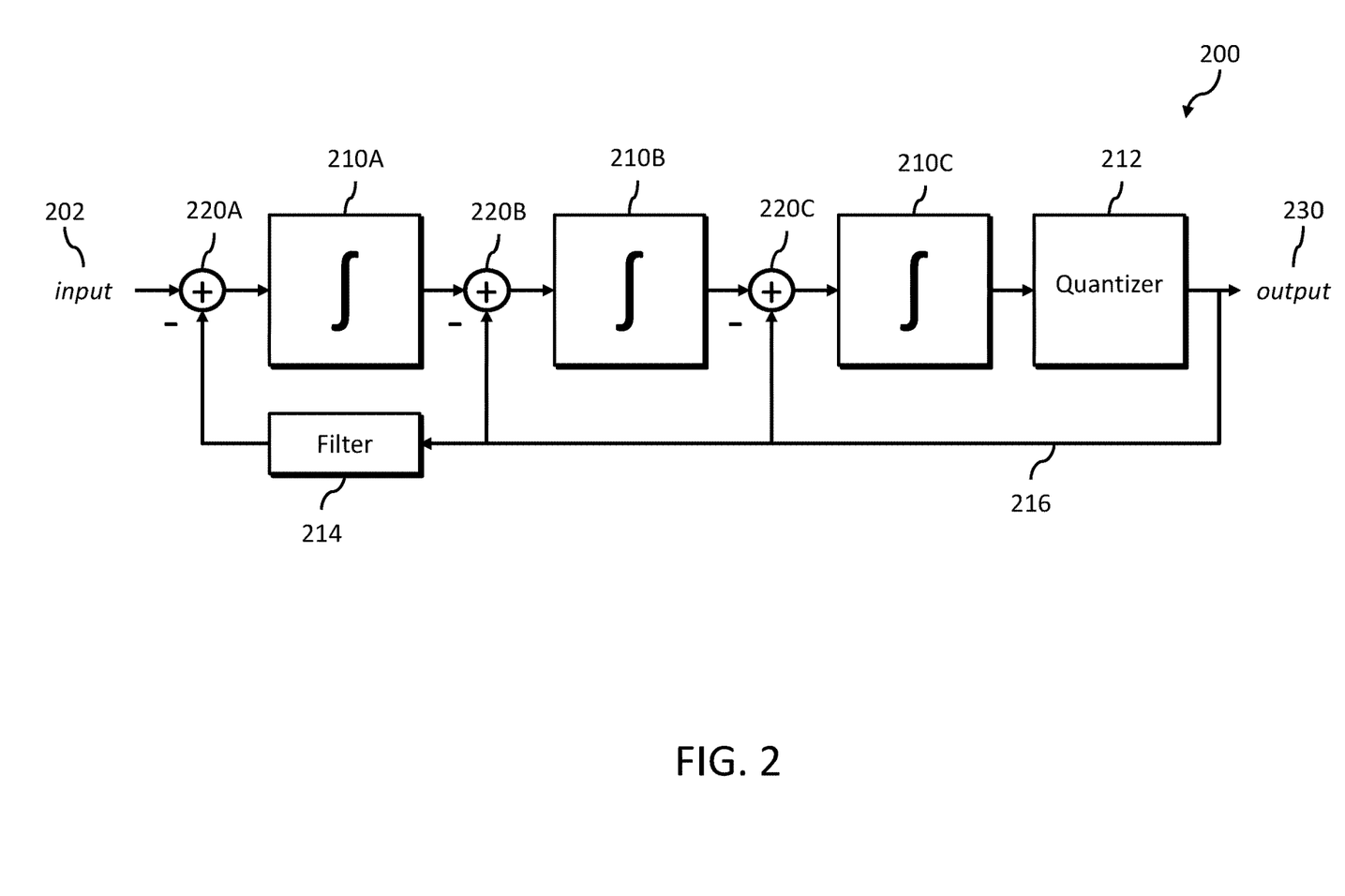
FIG. 2 illustrates an example class-D amplifier circuit with filtered feedback, in accordance with embodiments of the disclosure.

Referring to FIG. 2, an embodiment of a new class-D amplifier architecture with selective output filtering will now be described. A class-D amplifier circuit 200 receives an input audio signal 202, such as an audio signal for output to a speaker. The input audio signal 202 is fed through a plurality of integrators 210A, 210B and 210C followed by a quantizer 212 to produce an amplified audio output signal 230. To be able to handle a fast class-D signal as input, the integrators 210A-C the class-D amplifier circuit 200 are designed with a high bandwidth, which produces a circuit with relatively high-power consumption. An unfiltered feedback signal 216 is subtracted from the input signals to integrator 210B and integrator 210C, by components 220B and 220C (e.g., adders), respectively. A filter 214 receives the feedback signal 216 and generates a filtered feedback signal which is subtracted from input audio signal 202 by component 220A (e.g., an adder) for input to the first integrator 210A.

In the illustrated embodiment, the feedback filter is only provided to the input of the first integrator 210A. The subsequent integrator stages 210B and 210C see the unfiltered class-D output as input. By way of explanation, a feedback loop comprising three integrators has close to zero high frequency output. Therefore, adding some filtering in the loop as illustrated doesn't negatively affect the quality of the output audio signal. The first integrator sees a quieter input due to the filtered feedback and can therefore be designed with relaxed specifications. Because adding the filter 214 to the input of the first integrator 210A does not have much impact on the main loop, the loop bandwidth and response time can be kept as fast as an unfiltered class-D amplifier. The class-D amplifier 200 of FIG. 2, with the presence of the extra feedback filter, can be implemented with lower loop delay.

Figure 3:
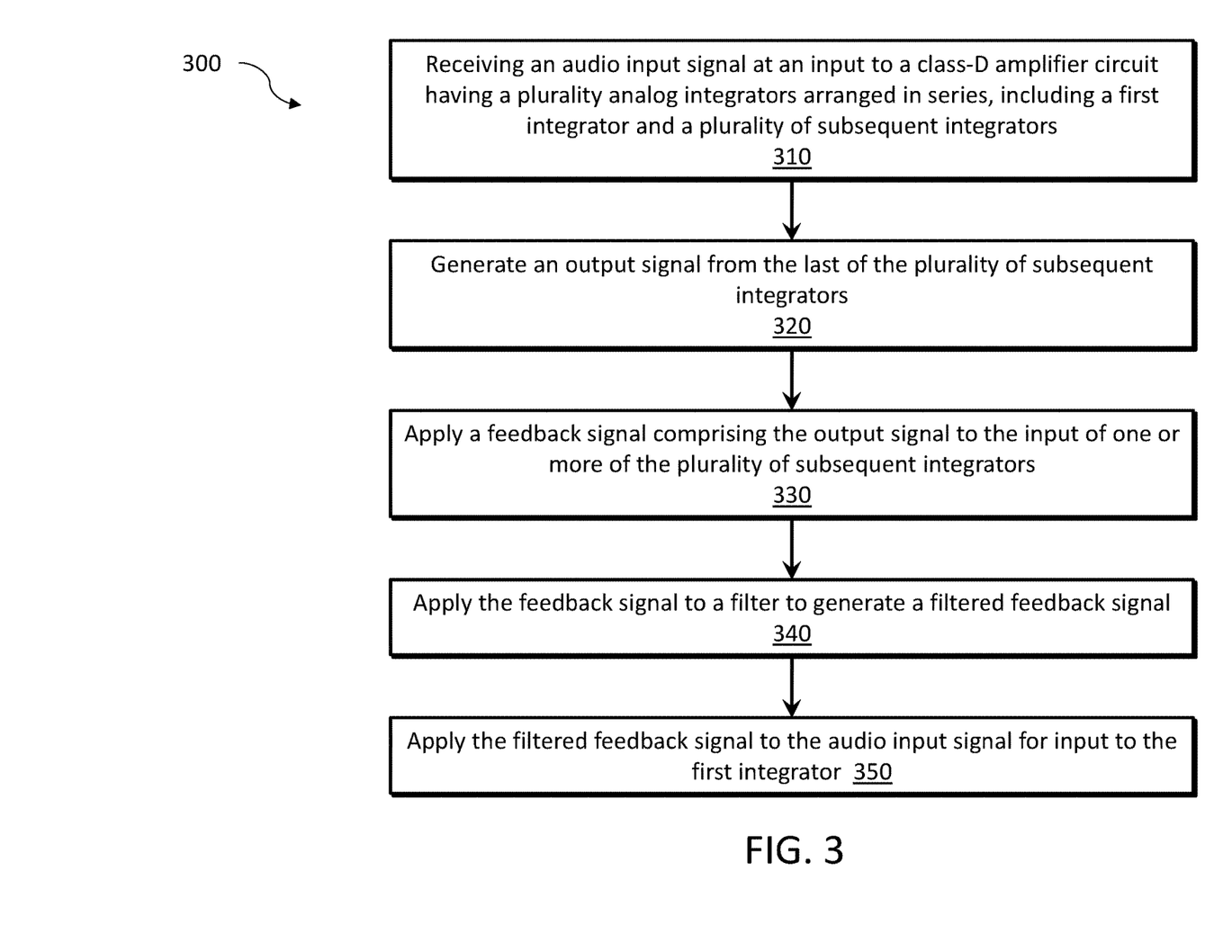
FIG. 3 is a flow chart illustrating a method for operating the class-D amplifier circuit with filtered feedback of FIG. 2, in accordance with an embodiment of the disclosure.

Referring to FIG. 3, an embodiment of a method for low delay, low power, high linearity class-D modulation will now be described. The process 300 starts, in step 310, by receiving an audio input signal at an input to a class-D amplifier circuit having a plurality of integrators arranged in series, including a first integrator and a plurality of subsequent integrators. In step 320, an output signal is generated by the last of the plurality of subsequent integrators. In step 330, a feedback signal comprising the output signal is applied to the input of each of the plurality of subsequent integrators. In step 340, the feedback signal is applied to a filter to generate a filtered feedback signal. In step 350, the filtered feedback signal is applied to the audio input signal for input to the first integrator.

Figure 4:
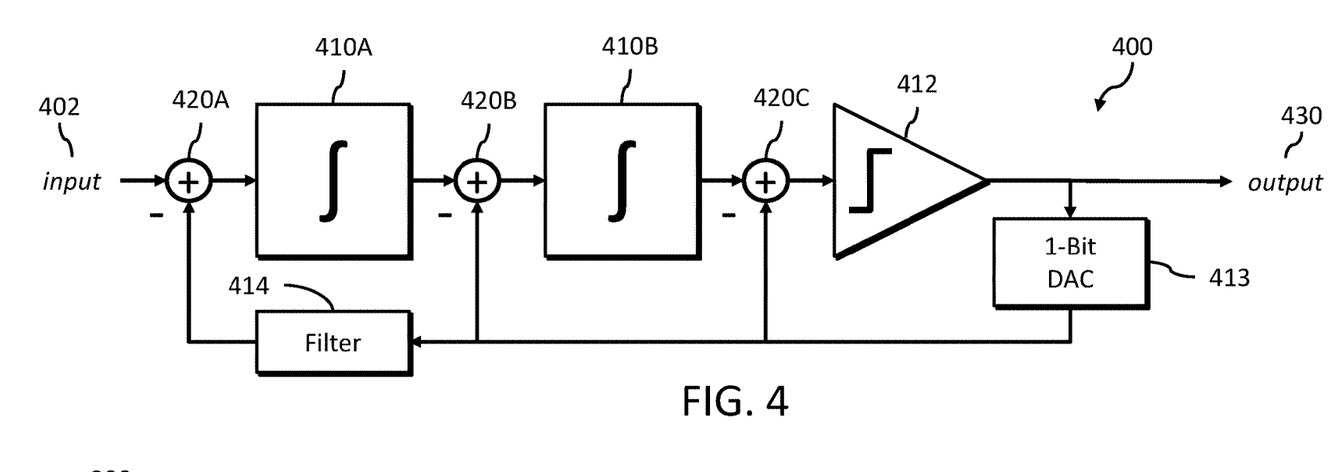
FIG. 4 illustrates an example delta-sigma modulator circuit with filtered feedback, in accordance with embodiments of the disclosure.
Figure 5:
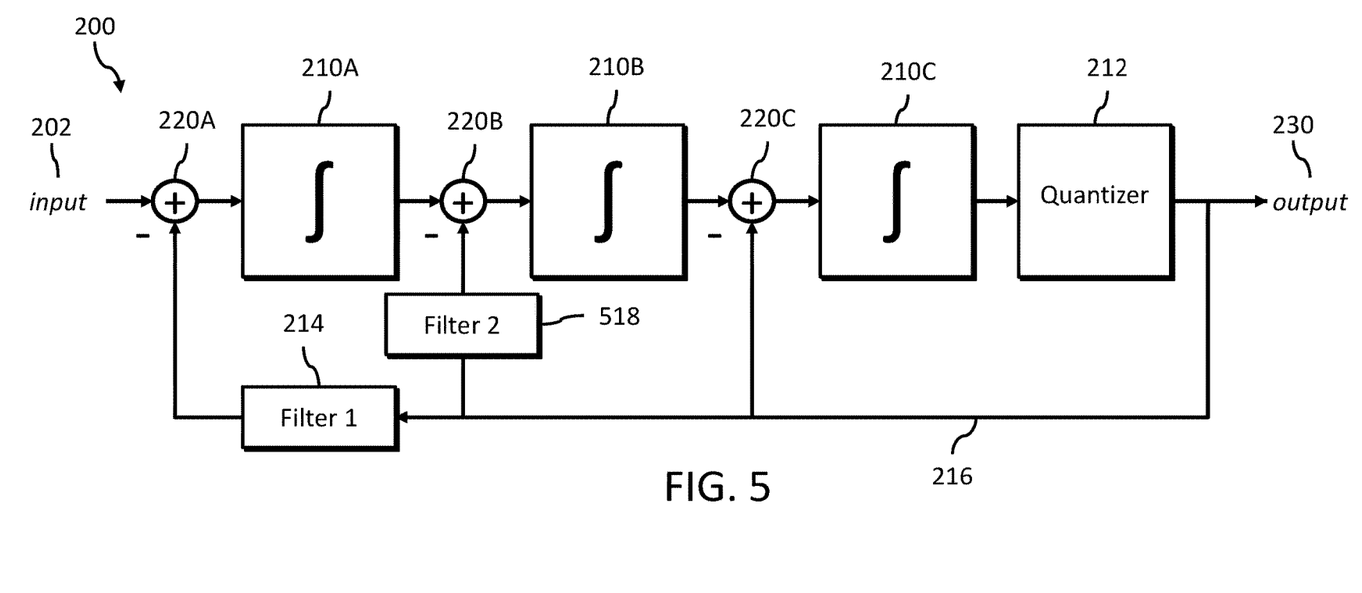
FIG. 5 illustrates an example class-D amplifier circuit with a plurality of filtered feedback signals, in accordance with embodiments of the disclosure.

In various embodiments, the systems, techniques, and methods described herein can be implemented in other circuits, such as a continuous delta sigma analog to digital converter. An example implementation of a delta sigma modulator in accordance with the present disclosure is illustrated in FIG. 4. As illustrated, a delta sigma modulator 400 receives an input signal 402, which is fed to a first integrator 410A, and then a second integrator 410B. The output of the second integrator is input to a comparator 412 which generates the output. The output signal 430 is feedback into the circuit through a 1-Bit Digital to Analog Converter 413 (DAC). The output of the 1-Bit DAC 413 is subtracted from the inputs to the second integrator 410B and the comparator 412, through components 420B and 420C (e.g., an adder or subtractor), respectively. The output of the 1-Bit DAC is also input to a filter 414, which is configured to generate a filtered feedback signal, which is subtracted from the input signal 402 by component 420A (e.g., an adder or subtractor) before input to the first integrator 410A. In other embodiments, a second filter 518 (as illustrated in FIG. 5) can be added to the feedback path to the second integrator input. It will be appreciated that the filter can be a first order filter or comprise other filter orders.

Figure 6:
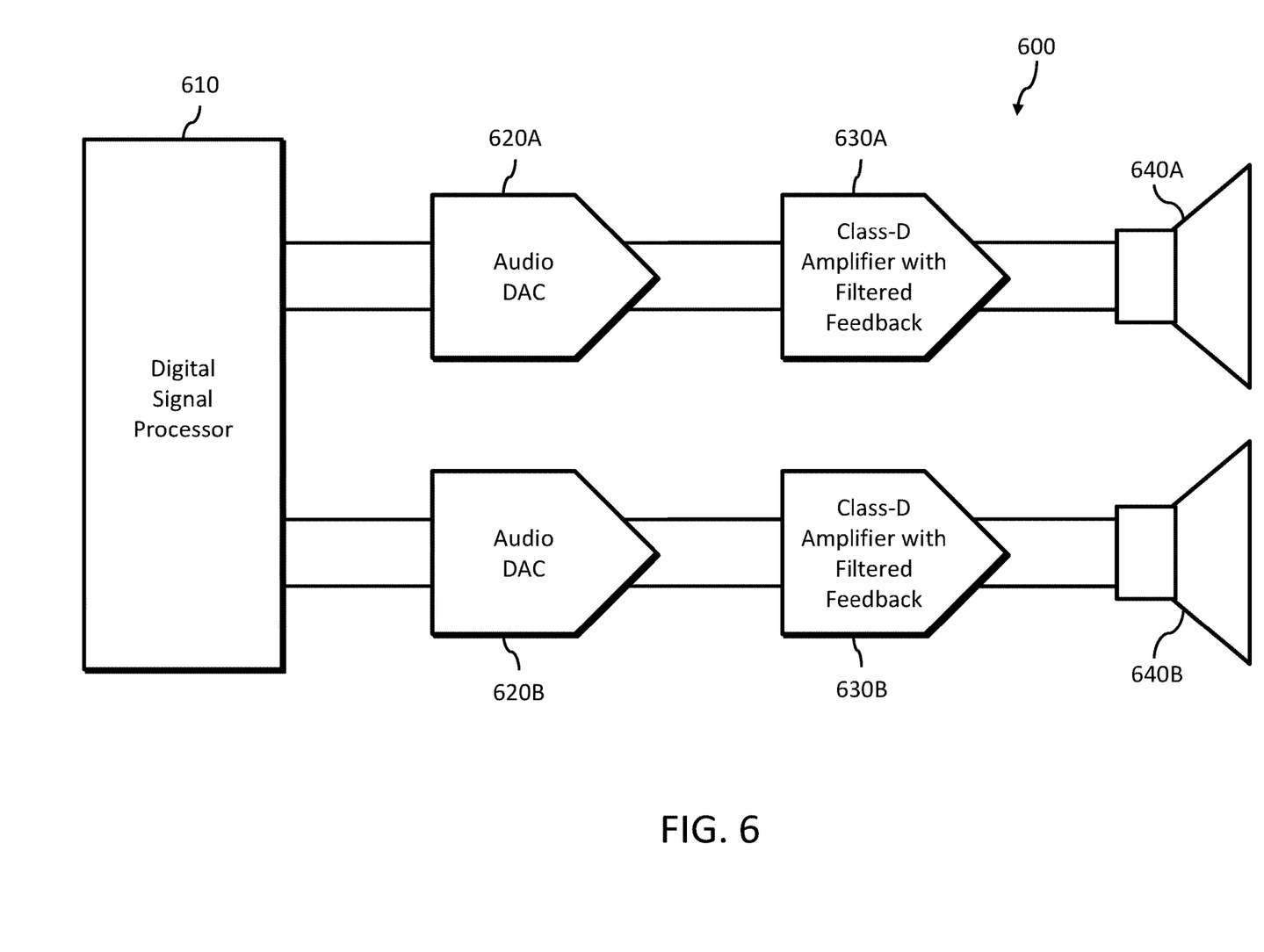
FIG. 6 illustrates an example audio output stage using an embodiment of a class-D amplifier circuit, in accordance with embodiments of the disclosure.

Referring to FIG. 6, an audio output stage 600 is illustrated in accordance with an embodiment of the present disclosure. A digital signal processor 610 outputs a stereo audio signal for playback on a pair of loudspeakers 640A and 640B. Each channel of the stereo audio signal is provided to a separate output path that includes an audio digital to analog converter (620A and 620B), a class-D amplifier with filtered feedback (630A and 630B) which may include the class-D amplifiers described with reference to FIGS. 2 and 5, and a loudspeaker (640A and 640B).

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A method comprising:
    receiving an audio input signal at an input of an audio amplifier circuit comprising a series of integrators;
    processing the audio input signal through the series of integrators;
    generating an audio output signal using a quantizer arranged to receive an output from the last integrator in the series;
    feeding back the audio output signal as a feedback signal which is applied to a respective input of each of the integrators in the series; and
    filtering the feedback signal at the respective input of the first integrator in the series and not at the respective inputs of any of the remaining integrators in the series.

2. The method of claim 1, further comprising feeding an output of the last integrator in the series to a comparator which generates the audio output signal.

3. The method of claim 1, wherein the first integrator in the series receives the audio input signal and generates a first output which is provided as the respective input to the second integrator in the series.

4. The method of claim 1, wherein filtering the feedback signal at the respective input of the first integrator in the series comprises applying the feedback signal to a digital to analog converter.

5. The method of claim 4, wherein an output of the digital to analog converter is subtracted from the respective input to the second integrator in the series and a respective input to a comparator which generates the audio output signal.

6. The method of claim 5, wherein the digital to analog converter is a 1-bit digital to analog converter.

7. The method of claim 1, wherein the audio amplifier circuit comprises a delta sigma modulator.

8. A circuit comprising:
    a series of integrators configured to receive an input signal at the first integrator in the series and generate an integrated signal from the last integrator in the series;
    a quantizer arranged to receive the integrated signal and generate an output signal; and
    a feedback signal path configured to:
        receive a feedback signal comprising the output signal;
        filter the feedback signal at a respective input of the first integrator in the series and not at respective inputs of any of the remaining integrators in the series; and
        apply the feedback signal to the respective input of the second integrator in the series.

9. The circuit of claim 8, wherein the circuit is a class-D amplifier.

10. The circuit of claim 8, wherein the circuit is a delta-sigma modulator.

11. The circuit of claim 8, wherein the input signal is an analog audio signal.

12. The circuit of claim 8, wherein the quantizer is configured to receive an output generated from the last integrator in the series and generate an amplified audio output signal.

13. The circuit of claim 8, wherein the first integrator in the series is configured for higher linearity and/or lower noise than other integrators in the series.

14. A system comprising:
    an audio amplifier configured to receive an audio input signal and output an amplified audio signal to a loudspeaker, the audio amplifier comprising:
        a series of integrators configured to receive the audio input signal and generate the amplified audio signal; and
        a feedback signal path configured to receive the amplified audio signal and filter the amplified audio signal at a respective input of the first integrator in the series and not at respective inputs of any of the remaining integrators in the series.

15. The system of claim 14, wherein the audio amplifier further comprises a quantizer configured to receive an output generated from the last integrator in the series and generate the amplified audio signal.

16. The system of claim 14, wherein the first integrator in the series is configured for higher linearity and/or lower noise than other integrators in the series.

17. The system of claim 14, wherein the feedback signal path is further configured to apply an unfiltered feedback signal to the respective input of the second integrator in the series and/or one or more subsequent integrators in the series.

18. The system of claim 17, wherein applying the unfiltered feedback signal to the respective input of the second integrator in the series and/or one or more subsequent integrators in the series comprises subtracting the unfiltered feedback signal from an output of an immediately preceding integrator in the series.

19. The system of claim 18, further comprising a plurality of subtractor components, each of the subtractor components arranged to receive an output from one of the integrators in the series and the unfiltered feedback signal.

20. The system of claim 14, further comprising a digital signal processor configured to generate the audio input signal.

* * * * *